(12) United States Patent
Anzalone et al.

(10) Patent No.: US 10,475,673 B2
(45) Date of Patent: Nov. 12, 2019

(54) APPARATUS FOR MANUFACTURING A SILICON CARBIDE WAFER

(71) Applicant: STMICROELECTRONICS S.R.L., Agrate Brianza (IT)

(72) Inventors: Ruggero Anzalone, Viagrande (IT); Nicolo Frazzetto, San Giovanni la Punta (IT); Aldo Raciti, Misterbianco (IT); Marco Antonio Salanitri, Catania (IT); Giuseppe Abbondanza, San Giovanni la Punta (IT); Giuseppe D'Arrigo, San Giovannia la Punta (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 6 days.

(21) Appl. No.: 15/715,940

(22) Filed: Sep. 26, 2017

(65) Prior Publication Data

US 2018/0090350 A1    Mar. 29, 2018

Related U.S. Application Data

(60) Provisional application No. 62/401,064, filed on Sep. 28, 2016.

(51) Int. Cl.
| | |
|---|---|
| *H01L 21/67* | (2006.01) |
| *H01L 21/02* | (2006.01) |
| *H01L 21/687* | (2006.01) |
| *C23C 16/32* | (2006.01) |
| *C23C 16/458* | (2006.01) |

(52) U.S. Cl.
CPC .. *H01L 21/67109* (2013.01); *H01L 21/02381* (2013.01); *H01L 21/02529* (2013.01); *H01L 21/02609* (2013.01); *H01L 21/02614* (2013.01)

(58) Field of Classification Search
CPC ... C23C 16/01; C23C 16/0218; C23C 16/325; C23C 16/4583; C30B 19/04; C30B 19/08; C30B 19/12; C30B 29/36; C30B 33/00; C30B 33/06; C30B 9/06; H01L 21/02381;
(Continued)

(56) References Cited

U.S. PATENT DOCUMENTS

| | | | |
|---|---|---|---|
| 3,777,009 A | 12/1974 | Menashi et al. | |
| 4,537,651 A | 8/1985 | Shuskus et al. | |

(Continued)

FOREIGN PATENT DOCUMENTS

| | | | | |
|---|---|---|---|---|
| EP | 2378557 A1 | * | 10/2011 | ............. B82Y 10/00 |
| EP | 2808897 A1 | * | 12/2014 | ....... H01L 29/66666 |
| WO | WO-2014006503 A2 | * | 1/2014 | ............. B82Y 10/00 |

*Primary Examiner* — Edward Chin
(74) *Attorney, Agent, or Firm* — Seed IP Law Group LLP

(57) ABSTRACT

Various embodiments provide a reaction chamber including a support, a receptacle, and a sponge. The support includes a plurality of bars that are spaced from each other by a plurality of openings. Each of the bars has side surfaces that are slanted or tilted downward such that melted material may readily flow through the openings. The support is covered with a coating of silicon carbide to prevent materials from adhering to the support. The receptacle underlies the support and is configured to collect any melted material that is drained through the openings of the support. The sponge is positioned in the receptacle and under the support. The sponge is configured to absorb any melted material that is collected by the receptacle.

19 Claims, 6 Drawing Sheets

(58) Field of Classification Search
CPC ......... H01L 21/02529; H01L 21/02609; H01L 21/7806
See application file for complete search history.

(56) References Cited

U.S. PATENT DOCUMENTS

| | | | |
|---|---|---|---|
| 4,574,730 A | 3/1986 | Svilans | |
| 4,582,561 A | 4/1986 | Ioku et al. | |
| 4,845,539 A * | 7/1989 | Inoue | H01L 27/10841 257/302 |
| 5,183,529 A | 2/1993 | Potter et al. | |
| 5,277,933 A * | 1/1994 | Claar | C04B 35/652 427/248.1 |
| 8,049,203 B2 * | 11/2011 | Samuelson | B82Y 10/00 257/13 |
| 8,563,380 B2 * | 10/2013 | Richter | B82Y 10/00 257/E21.41 |
| 9,318,583 B2 * | 4/2016 | Verhulst | H01L 29/66666 |
| 9,406,504 B2 | 8/2016 | Frisina et al. | |
| 9,461,182 B2 * | 10/2016 | Sommer | H01L 27/115 |
| 2002/0072249 A1 | 6/2002 | Nagasawa et al. | |
| 2006/0233670 A1 * | 10/2006 | Lehto | B01L 3/0293 422/400 |
| 2007/0228491 A1 * | 10/2007 | Forbes | H01L 29/0657 257/401 |
| 2007/0266931 A1 | 11/2007 | Mueller et al. | |
| 2009/0175777 A1 | 7/2009 | Scarsbrook et al. | |
| 2010/0176459 A1 * | 7/2010 | Wernersson | B82Y 10/00 257/392 |
| 2010/0200916 A1 * | 8/2010 | Gossner | H01L 29/083 257/335 |
| 2010/0270593 A1 * | 10/2010 | Lung | H01L 27/101 257/208 |
| 2011/0049476 A1 * | 3/2011 | Bjoerk | H01L 29/7391 257/24 |
| 2011/0233512 A1 * | 9/2011 | Yang | B82Y 10/00 257/9 |
| 2012/0187376 A1 * | 7/2012 | Tomioka | B82Y 10/00 257/24 |
| 2013/0157448 A1 * | 6/2013 | Frisina | C30B 33/00 438/488 |
| 2014/0021532 A1 * | 1/2014 | Bhuwalka | H01L 29/66356 257/329 |
| 2014/0054549 A1 * | 2/2014 | Loh | H01L 29/66356 257/27 |
| 2014/0203350 A1 * | 7/2014 | Chuang | H01L 29/66356 257/329 |
| 2014/0203351 A1 * | 7/2014 | Chuang | H01L 21/26513 257/329 |
| 2014/0203352 A1 * | 7/2014 | Chuang | H01L 29/66356 257/329 |
| 2014/0231902 A1 * | 8/2014 | Chuang | H01L 29/7827 257/329 |
| 2016/0348222 A1 * | 12/2016 | Isaac | B22F 9/10 |

* cited by examiner

APPARATUS FOR MANUFACTURING A SILICON CARBIDE WAFER

BACKGROUND

Technical Field

The present disclosure is directed to a reaction chamber for fabricating a silicon carbide wafer.

Description of the Related Art

A semiconductor device includes various electronic components fabricated in a semiconductor substrate. Most semiconductor devices are fabricated in silicon (Si) wafers. Silicon carbide (SiC) wafers, however, have become increasing popular due, at least in part, to the chemical-physical properties of SiC. For example, compared to Si, SiC has a high band gap. As a result, a SiC wafer, even with a relatively small thickness, has a high breaking voltage compared to a Si wafer. Accordingly, SiC wafers are desirable for applications that have high voltages, such as power applications.

Silicon carbide may occur in a number of different chrystallographic structures or polytypes. The most common polytypes are the cubic polytype (3C polytype), the hexagonal polytype (4H and 6H polytypes), and the rhombohedric polytype (15R polytype).

BRIEF SUMMARY

The present disclosure is directed to a reaction chamber and a method for fabricating a silicon carbide (SiC) wafer, such as a cubic polytype (3C) SiC wafer, using the reaction chamber.

According to one embodiment, the reaction chamber includes a body, a heating device, an input duct, an output duct, a support, and a receptacle. The body includes a chamber in which the support and the receptacle are positioned. The heating device is configured to heat the chamber. The input duct is configured to input a precursor into the chamber. The output duct is configured to discharge reaction gases from the chamber to an environment outside the body. The support is positioned in the chamber and provides a platform for a substrate. The support includes a plurality of bars that are spaced from each other by a plurality of openings. Each of the bars has side surfaces that are slanted or tilted downward such that melted material, such as molten silicon, may readily slide through the openings. In at least one embodiment, the support is covered with a coating of silicon carbide to prevent the melted material from adhering to the support. The receptacle is positioned in the chamber and directly underlies the support. The receptacle is configured to collect any melted material that is drained through the openings of the support. In at least one embodiment, a sponge is positioned in the receptacle and directly under the openings of the support. The sponge absorbs a portion of or all of the melted material that flows through the openings of the support.

According to one embodiment, the method for fabricating the silicon carbide wafer includes positioning a silicon crystalline substrate on the support of the reaction chamber, and forming a first layer of silicon carbide on the wafer by exposing the wafer to a flow of precursors (i.e., hetero-epitaxy). The silicon crystalline substrate has a first melting temperature and the silicon carbide has a second melting temperature that is higher than the first melting temperature. The method further includes heating the reaction chamber to a temperature that is higher than the first melting temperature and lower than the second melting temperature such that the silicon crystalline substrate beings to melt. The melted silicon crystalline substrate drains through the openings of the support and into the receptacle, where it is collected by the sponge. The temperature of the reaction chamber is maintained until the wafer is substantially separated from the semiconductor material. Simultaneously with the melting of the silicon crystalline substrate, the first layer of silicon carbide is exposed to a flow of precursors to form a second layer of silicon crystalline substrate (i.e., homoepitaxy). Once the silicon carbide reaches a desired thickness, the reaction chamber is shut down and returned back to room temperature. The melted silicon crystalline substrate collected by the sponge is then disposed of by removing the sponge from the receptacle.

DETAILED DESCRIPTION

Figure 1:
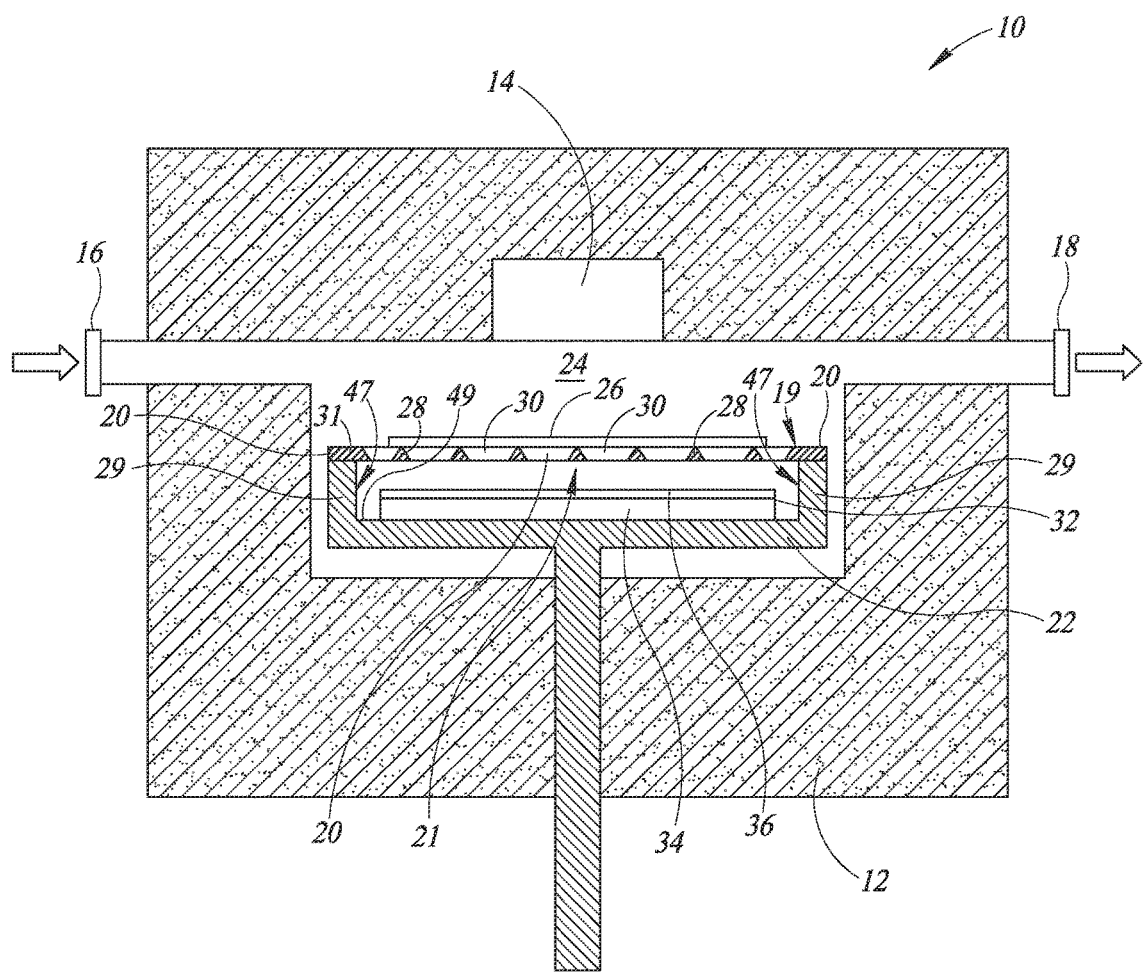
FIG. 1 is a cross-sectional view of a reaction chamber according to one embodiment disclosed herein.

In the following description, certain specific details are set forth in order to provide a thorough understanding of various embodiments of the disclosure. However, one skilled in the art will understand that the disclosure may be practiced without these specific details. In some instances, well-known details associated with reaction chambers and semiconductors have not been described to avoid obscuring the descriptions of the embodiments of the present disclosure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

One solution for fabricating a silicon carbide (SiC) wafer is disclosed in U.S. Pat. No. 9,406,504, entitled "Reaction Chamber Including a Susceptor Having Draining Openings for Manufacturing a Silicon Carbide Wafer." The fabrication of the SiC wafer disclosed in U.S. Pat. No. 9,406,504 includes, for example, placing a silicon substrate on a susceptor of a reaction chamber, growing a 3C—SiC epitaxial layer on the silicon substrate, and then separating the silicon substrate from the 3C—SiC epitaxial layer by melting the silicon substrate. The melted silicon is drained through a plurality of drain openings of the susceptor and into a gathering tank.

The inventors, however, have since discovered that the reaction chamber described in U.S. Pat. No. 9,406,504 has several drawbacks. One drawback, for example, is that the susceptor disclosed in U.S. Pat. No. 9,406,504 may not allow the silicon to completely separate from the 3C—SiC epitaxial layer. Rather, the inventors have discovered that the melted silicon may sometimes adhere to the upper and lower surfaces of the susceptor and clog the drain openings of the susceptor. Another drawback identified by the inventors is that the silicon may not be easily removed from the gathering tank and disposed of after the fabrication of the SiC wafer is completed, as the melted silicon collected by the gathering tank may sometimes adhere to the gathering tank.

An improved reaction chamber and a method for fabricating a SiC wafer using the improved reaction chamber are described herein. The reaction chamber may address one or more of the problems associated with the reaction chamber described in U.S. Pat. No. 9,406,504.

FIG. 1 is a cross-sectional view of a reaction chamber 10 according to one embodiment. The reaction chamber 10 includes a body 12, a heating device 14, an input duct 16, an output duct 18, a support 20, and a receptacle 22.

The body 12 includes a chamber 24. The support 20 and the receptacle 22 are positioned in the chamber 24. In one embodiment, the body 12 is made of an insulating material that thermally insulates the chamber 24 from an external environment.

The heating device 14 is coupled to the body 12. The heating device heats the chamber 24. The heating device 14 may be any heating device configured to heat the support 20 by any heating techniques known or later developed. In one embodiment, the heating device 14 is an inductive heater including, for example, a plurality of coils. In one embodiment, the heating device 14 is a resistive heater including, for example, carbide covered resistors.

The input duct 16 provides a fluidic path from an environment external to the reaction chamber 10 into the chamber 24 of the body 12. In one embodiment, as will be discussed in further detail below, the input duct 16 is used to input a precursor into the chamber 24 of the body 12. A precursor is a gas flow that carries, in gaseous form, particles of material to be deposited on a substrate on the support 20.

The output duct 18 provides a fluidic path from the chamber 24 of the body 12 to an environment external to the reaction chamber 10. In one embodiment, as will be discussed in further detail below, the output duct 18 is used to discharge reaction gases from the chamber 24 to outside the body 12.

In at least one embodiment, the reaction chamber 10 is a horizontal flux reaction chamber. In this embodiment, the input duct 16 and the output duct 18 are arranged in such a way that a precursor flows longitudinally along an upper surface of the support 20. For example, as shown in FIG. 1, the input duct 16 and the output duct 18 are horizontally aligned with each other and positioned above the support 20. In another embodiment, the reaction chamber 10 is a vertical flux reaction chamber. In this embodiment, the input duct 16 and an output duct 18 are arranged such that a precursor flows perpendicular to the upper surface of the support 20.

The support 20 is positioned on the receptacle 22 and in the chamber 24. The support 20 provides a platform for a substrate. For example, as shown in FIG. 1, a silicon crystalline substrate 26 is positioned on an upper side 19 of the support 20. The support 20 is often referred to as a susceptor. The support 20 includes a plurality of bars 28 that are spaced from each other by a plurality of openings 30. The bars 28 and the openings 30 are coupled to each other by a coupling portion 31.

The plurality of openings 30 provide openings for material to drain through. Namely, when material, such as the silicon crystalline substrate 26, is positioned on the upper side 19 of the support 20 and is melted, the melted material will flow from the upper side 19 of the support 20, through the openings 30, to a lower side 21 of the support 20, and into the receptacle 22.

In at least one embodiment, the support 20 is covered with a coating to prevent materials from adhering to the support 20. The coating facilitates melted material to flow through the openings 30 and prevents the openings 30 from being clogged. In one embodiment, the coating includes silicon carbide. In one embodiment, each of the bars 28, including the upper and lower surfaces of the bars 28, is covered with the coating. In one embodiment, the entire support 20, including upper and lower surfaces of the coupling portion 31 and the bars 28, is covered with the coating.

The support 20 will be discussed in further detail with respect to FIGS. 2 to 4.

The receptacle 22 is positioned in the chamber 24 and directly underlies the support 20. The support 20 is positioned on sidewalls 29 of the receptacle 22. The receptacle 22 collects any material that is melted from the upper surface of the support 20 and drains through the openings 30 of the support 20.

In at least one embodiment, similar to the support 20, the receptacle 22 is covered with a coating to prevent materials from adhering to the receptacle 22. The coating on the receptacle 22 facilitates removal of material collected by the receptacle 22. The coating may be the same material as or different from the coating on the support 20. In one embodiment, referring to FIG. 1, inner surfaces 47 of the sidewalls 29 and the bottom surface 49 of the receptacle 22 are covered with the coating.

In one embodiment, a sponge 32 is positioned in the receptacle 22 and directly under the support 20. The sponge 32 absorbs any material that is melted and flows through the openings 30 of the support 20. Absorbing molten material into the sponge 32 prevents adhesion of melted material to the receptacle 22. By using the sponge 32, melted material collected by the receptacle 22 may be easily removed, even after solidification of the melted material, from the receptacle 22 without any further diffusion by simply removing the sponge 32. In one embodiment, the sponge 32 includes a graphite layer 34, and a carbon layer 36 on the graphite layer 34.

Figure 2:
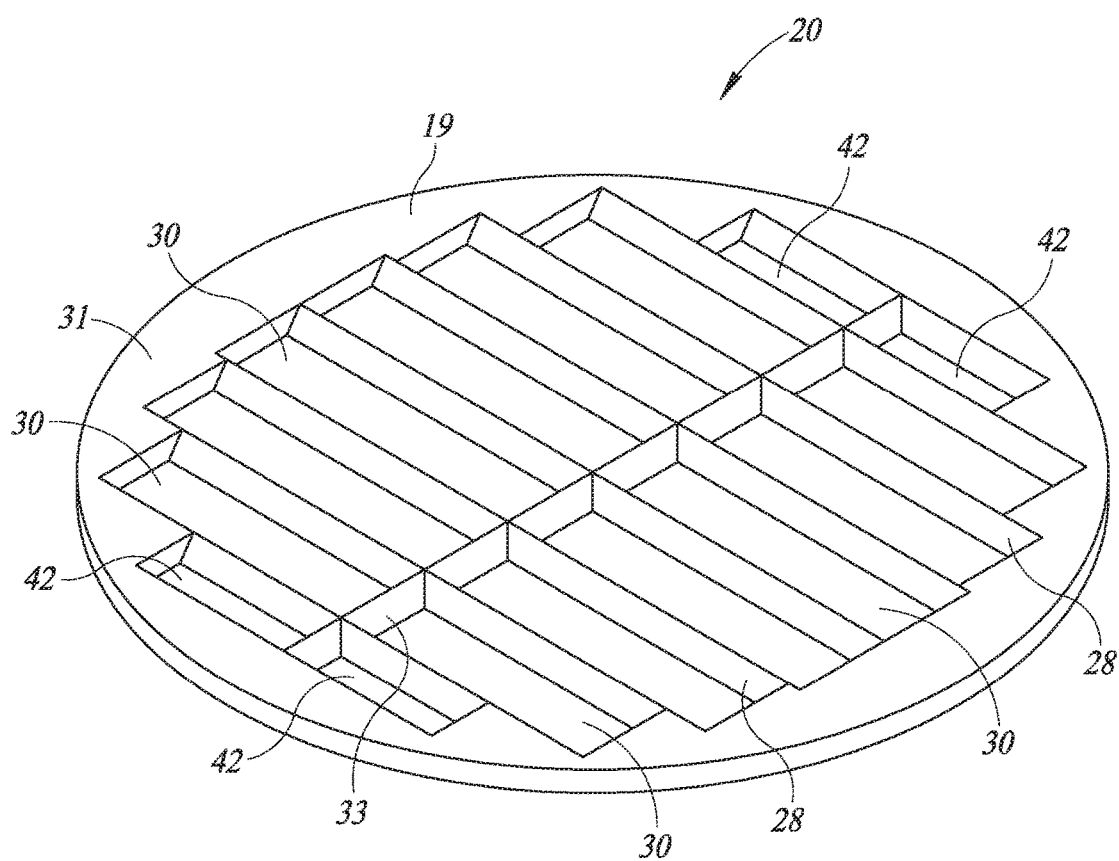
FIG. 2 is a perspective view of a support according to one embodiment disclosed herein.

FIG. 2 is a perspective view of the support 20 according to one embodiment. FIG. 3 is a plan view of the support 20 according to one embodiment. FIG. 4 is a cross-sectional view of the support 20 along the axis shown in FIG. 3 according to one embodiment. It is beneficial to review FIGS. 2 to 4 simultaneously.

The support 20 includes a plurality of bars 28 that are spaced from each other by the openings 30. The bars 28 are coupled to each other by the coupling portion 31. The support 20 may have any shape, such as a circle, square, or rectangle. In the embodiment shown in FIG. 2A, the support 20 has a circular shape.

As previously discussed, the openings 30 provide openings for melted material to drain through. In particular, when material is positioned on the upper side 19 of the support 20 and is melted, the melted material will flow from the upper side 19 of the support 20, through the openings 30, to a lower side 21 of the support 20, and into the receptacle 22.

Each of the bars 28 have side surfaces 50 that are slanted or tilted downward so that melted material may readily slide through the openings 30. As best shown in FIG. 4, each of the bars 28 transition from a first width at the upper side 19 of the support 20 to a second width that is larger than the first width at the lower side 21 of the support 20. In addition, each of the bars 28 has an angle 46 between a side surface 50 and lower surface 51 that is less than 90 degrees. In one embodiment, the angle 46 is between about 55 degrees and 35 degrees.

Figure 4:
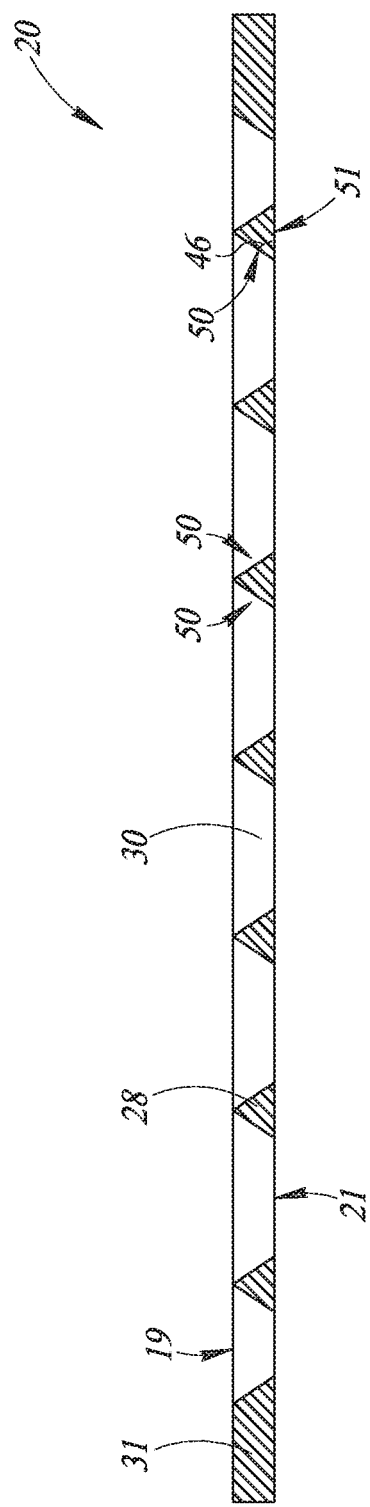
FIG. 4 is a cross-sectional view of a support along the axis shown in FIG. 3 according to one embodiment disclosed herein.

As best shown in FIG. 4, each of the bars 28 has a triangular cross section. In another embodiment, rather than each of the bars 28 forming a point (i.e., apex) at the upper side 19 of the support 20 as shown in FIG. 4, each of the bars 28 has a flat or planar surface at the upper side 19 of the support 20 to aid in receiving a substrate, such as the silicon crystalline substrate 26.

Figure 3:
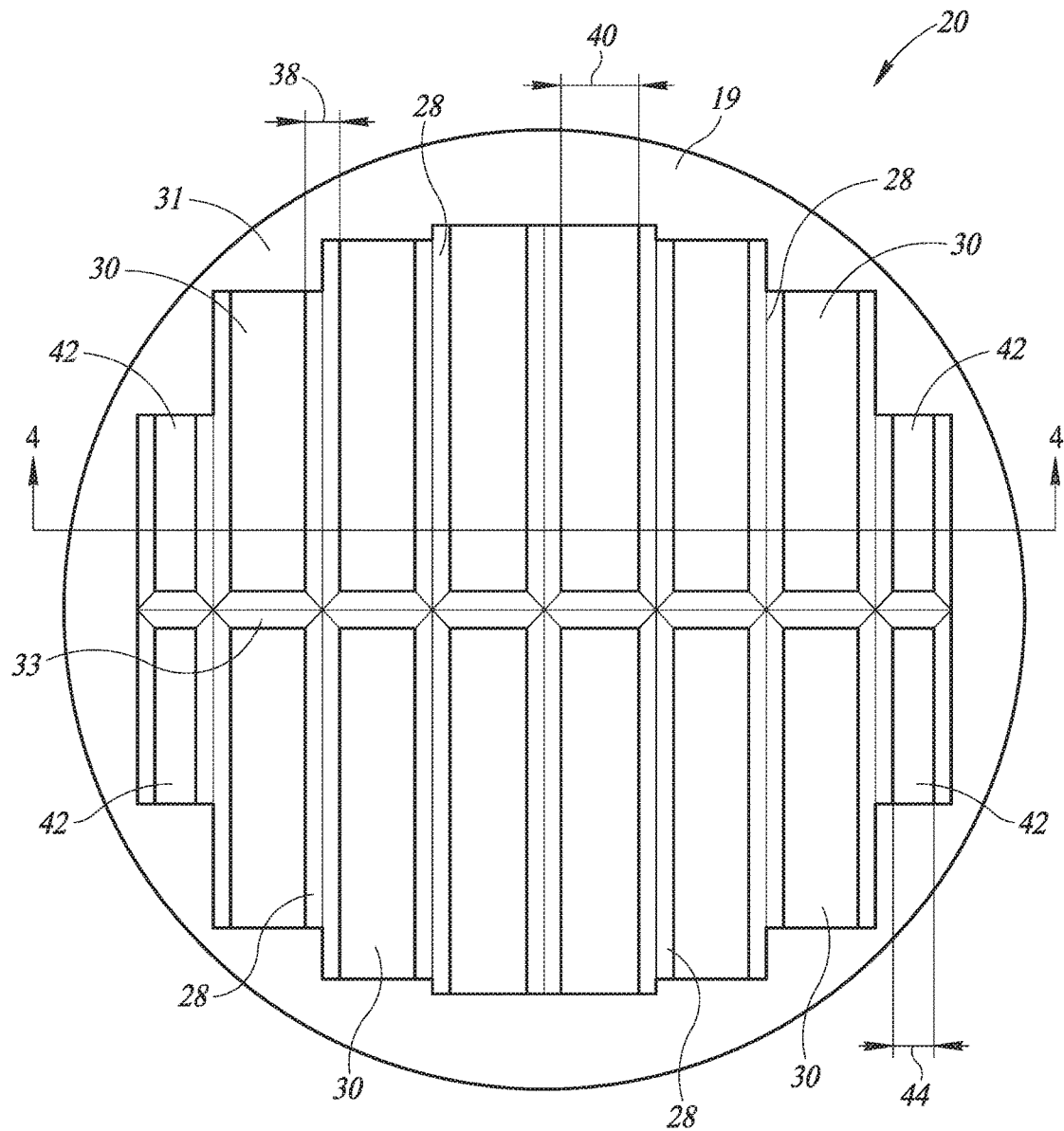
FIG. 3 is a plan view of a support according to one embodiment disclosed herein.

Referring to FIG. 3, each of the bars 28 has a width 38, which is the width of the lower surface 51 of the bars, and each of the openings 30 has a width 40. The width 40 is larger than the width 38 to maximize that amount of material that may flow through the openings 30. In one embodiment, the width 38 is between 3 and 7 mm. In one embodiment, the width 40 is between 20 and 25 mm.

As best shown in FIG. 3, the plurality of bars 28 includes a bar 33 to provide additional support for a substrate, such as the silicon crystalline substrate 26, positioned on the support 20. The bar 33 extends across the remaining bars 28. As shown in FIG. 3, the bars 28 extend in a first direction and the bar 33 extends in a second direction that is substantially perpendicular to the first direction.

As best shown in FIG. 3, outermost openings 42 of the openings 30 have a width 44 that is smaller than the width 40 to maximize the number of openings 30 that may be included in the support 20. For example, as best shown in FIG. 3, the decreased width 44 of the outermost openings 42 allows four additional openings in the support 20. In one embodiment, the width 44 is between 12 and 17 mm.

The support 20 is made of a material having a high melting temperature such that the support 20 does not melt when heated by the heating device 14. In particular, the support 20 has a melting temperature that is greater than a melting temperature of a substrate intended to be melted in the reaction chamber 10. For example, in the embodiment shown in FIG. 1, the support 20 will have a melting temperature that is greater than the melting temperature of the silicon crystalline substrate 26. In one embodiment, the support 20 is made of naked graphite having a high degree of pureness and a high dilatation coefficient.

FIGS. 5A to 5D are cross-sectional views illustrating various stages of a method of fabricating a SiC wafer using the reaction chamber 10 according to one embodiment. The body 12, the heating device 14, the input duct 16, and the output duct 18 are not shown in FIGS. 5A to 5D for simplicity.

Figure 5A:
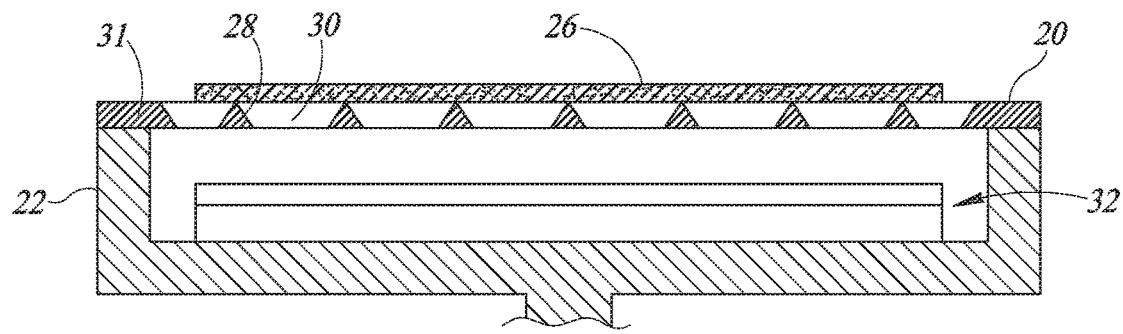
FIGS. 5A to 5D are cross-sectional views illustrating various stages of a method of fabricating a silicon carbide wafer using the reaction chamber of FIG. 1 according to one embodiment disclosed herein.

As shown in FIG. 5A, the silicon crystalline substrate 26 is positioned on the support 20. The chamber 24 may be at room temperature.

The chamber 24 is then sealed and is heated by the heating device 14 to a first temperature, such as to a temperature of 450 to 550 degrees Celsius. The pressure of the chamber 24 may also be controlled and set at about 10E-5 bar.

The chamber 24 is heated to a second temperature, which may be between 1050 to 1150 degrees Celsius, and at a pressure between 75-125 mbar. The chamber 24 is maintained between 1050 to 1150 degrees Celsius for the following steps and until the temperature is further increased as indicated below. The pressure of the chamber 24 is maintained between 75-125 mbar for the remainder of the process.

At the second temperature, silicon crystalline substrate 26 is immersed in hydrogen ($H_2$). The $H_2$ is introduced into chamber 24 through the input duct 16. In another embodiment, the silicon crystalline substrate 26 is immersed in $H_2$ prior to or simultaneously with Step 3.

At the second temperature, silicon crystalline substrate 26 is subjected to activation operations by introducing hydrogen chloride (HCl) into the chamber 24 through the input duct 16.

The reaction chamber 10 is heated by the heating device 14 to a third temperature, which may be between about 1340 to 1400 degrees Celsius. While the reaction chamber 10 is being heated by the heating device 14, a carbon precursor is introduced into the chamber 24 through the input duct 16. The carbon precursor carbonizes the superficial silicon atoms of the silicon crystalline substrate 26 to form a thin layer (in the order of few nanometers) of SiC, such as 3C SiC. This is often referred to as ramp carbonisation. As will be discussed below, the thin layer of SiC acts as a seed for SiC growth.

Figure 5B:
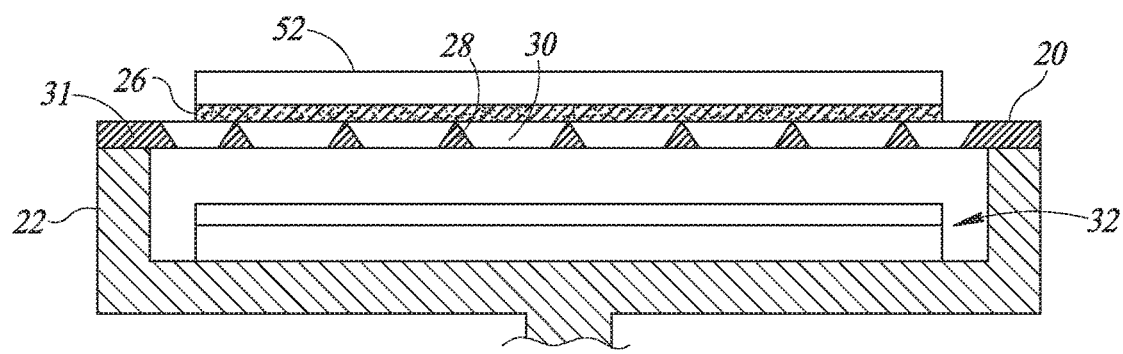

While the chamber is at the third temperature, a silicon precursor is added to the carbon precursor in the chamber 24. By introducing the silicon precursor into the chamber 24, a first SiC layer 52 begins to epitaxially grow from the thin layer of SiC as shown in FIG. 5B. This is often referred to as hetero-epitaxial growth.

While maintaining a flow of $H_2$ into the chamber 24 through the input duct 16, the chamber 24 is heated by the heating device 14 to a fourth temperature, which is greater than a melting temperature of the silicon crystalline substrate 26 and less than a melting temperature of the first SiC layer 52. In one embodiment, the fourth temperature is between 1475 to 1525 degrees Celsius.

Figure 5C:
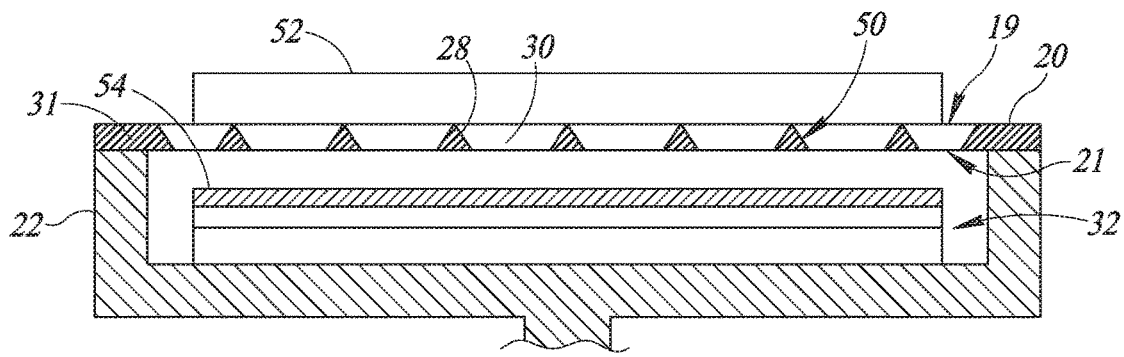

The temperature of the reaction chamber 10 is maintained at the fourth temperature. As a result, as shown in FIG. 5C, the silicon crystalline substrate 26 melts and drains into the receptacle 22 as melted silicon crystalline substrate 54. That is, the melted silicon crystalline substrate 54 flows from the upper side 19 of the support 20, through the openings 30, and to a lower side 21 of the support 20. The melted silicon crystalline substrate 54 is collected by the receptacle 22.

As previously discussed, each of the bars 28 have side surfaces 50 that are slanted or tilted downward. As a result, the melted silicon crystalline substrate 54 easily slides through the openings 30. Further, as mentioned above the support 20 may be covered with a coating to prevent materials from adhering to the support 20. In particular, the coating prevents the melted silicon crystalline substrate 54 from adhering to the bars 28 and clogging the openings 30.

The melted silicon crystalline substrate 54 may be absorbed by the sponge 32. The sponge 32 allows the melted silicon crystalline substrate 54 to be easily removed from the receptacle 22 by simply removing the sponge 32.

The fourth temperature of the chamber 24 is maintained until the silicon crystalline substrate 26 is substantially separated from the SiC layer 52.

Figure 5D:
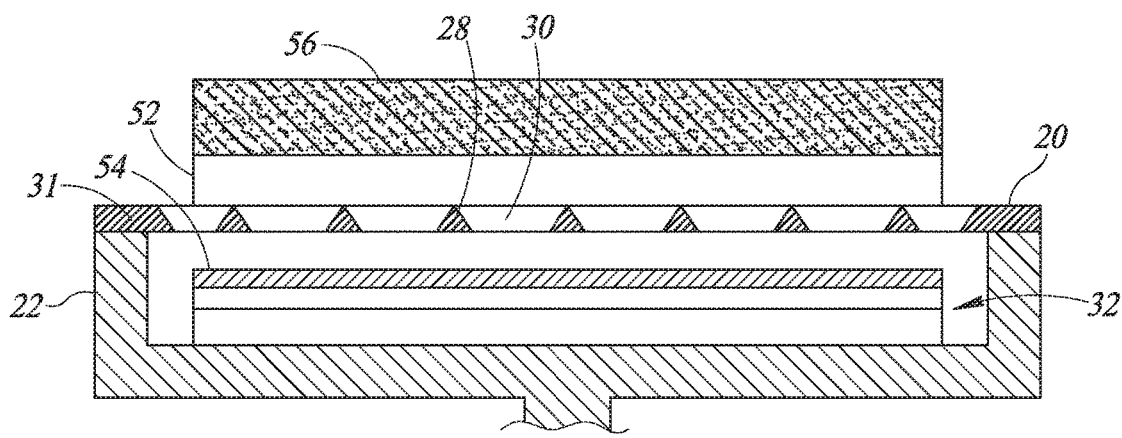

As shown in FIG. 5D, a flow of silicon and carbon precursor is introduced into the chamber 24 through the input duct 16. By introducing the silicon and carbon precursor into the chamber 24, a second SiC layer 56 begins to grow on the first SiC layer 52. This is often referred to as homo-epitaxial growth. In at least one embodiment, the flow of silicon and carbon precursor is performed simultaneously with the melting of the silicon crystalline substrate 54. In another embodiment, the flow of silicon and carbon precursor is performed after the silicon crystalline substrate 54 begins to melt.

As the SiC layer 56 reaches a desired thickness, the flow of silicon and carbon precursor is stopped, and any reaction gases in the chamber 24 are removed from the chamber 24 through the output duct 18. The reaction chamber 10 may be shut down, vented and returned to a lower temperatures, such as room temperature. In one embodiment, the resulting SiC wafer is subsequently immersed in $H_2$ or Ar.

The melted silicon crystalline substrate 54 may then removed from the receptacle 22 by removing the sponge 32.

Although the reaction chamber 10 has been largely discussed with respect to fabricating a SiC wafer from a silicon crystalline substrate, the reaction chamber 10 may be use for any process in which a first layer of material is melted and separated from a second layer of material that has a higher melting temperature than the first layer.

The various embodiments described above can be combined to provide further embodiments. These and other changes can be made to the embodiments in light of the above-detailed description. For instance, in some embodiments, the support does not include a bar 33 and the openings 30 extend substantially across the support. Similarly, in some embodiments, the openings have a same or varying width through the support. Further, although the method discussed above involves the chamber being raised to four temperatures stages, it is understood that fewer or more temperature stages may be used.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus, comprising:
   a chamber;
   a support in the chamber, the support having a first side and a second side opposite to the first side, the support including:
      a plurality of bars, each of the plurality of bars having a first width at the first side of the support and a second width at the second side of the support, the first width being smaller than the second width; and
      a plurality of openings, the plurality of bars being spaced from each other by the plurality of openings, each of the plurality of openings having a third width at the first side of the support and a fourth width at the second side of the support, the third width being larger than the fourth width, the second width being smaller than the fourth width;
   a receptacle in the chamber and at the second side of the support, the support being positioned above the receptacle, the receptacle positioned to collect material flowing from the first side of the support, through the plurality of openings, and to the second side of the support; and
   a sponge positioned on a surface of the receptacle, the sponge configured to absorb the material collected by the receptacle.

2. The apparatus of claim 1 wherein each of the plurality of bars has a triangular cross section.

3. The apparatus of claim 1, further comprising:
   a heater configured to heat the chamber;
   an input duct configured to introduce a gas into the chamber; and
   an output duct configured to remove the gas from the chamber.

4. The apparatus of claim 1 wherein the receptacle includes sidewalls, the support is positioned on the sidewalls, and the sponge is positioned between the sidewalls.

5. The apparatus of claim 1 wherein the receptacle is covered with a coating of silicon carbide.

6. The apparatus of claim 1 wherein the support is covered with a coating of silicon carbide.

7. The apparatus of claim 1 wherein the sponge includes a graphite layer, and a carbon layer on the graphite layer.

8. An apparatus, comprising:
   a support having a first side and a second side opposite to the first side, the support including:
      a coupling portion;
      a plurality of first bars extending in a first direction, each of the plurality of first bars having first and second side surfaces, each of the plurality of first bars having a first width at the first side of the support and a second width at the second side of the support, the first width being smaller than the second width;
      a second bar extending in a second direction traverse to the first direction, the plurality of first bars and the second bar being surrounded by the coupling portion and physically coupled to each other by the coupling portion;
      a plurality of first openings extending in the first direction, each of the plurality of first openings extending from the coupling portion to the second bar; and
      a plurality of second openings extending in the first direction, each of the plurality of second openings extending from the coupling portion to the second bar,
      the plurality of first openings being separated from the plurality of second openings by the second bar,
      the coupling portion, the plurality of first bars, and the second bar delimiting the plurality of first openings and the plurality of second openings,
      the first and second side surfaces of each of the plurality of first bars delimiting the plurality of first openings and the plurality of second openings being nonparallel with each other,
      each of the plurality of first and second openings having a third width at the first side of the support and a fourth width at the second side of the support, the third width being larger than the fourth width, the second width being smaller than the fourth width; and
   a receptacle positioned below the support, the receptacle positioned to collect material flowing from the first side of the support, through the plurality of openings, and to the second side of the support.

9. The apparatus of claim 8, further comprising:
   a sponge in the receptacle, the sponge configured to absorb the material collected by the receptacle.

10. The apparatus of claim 8 wherein each of the first, second, third, and fourth widths extending in the second direction.

11. The apparatus of claim 8 wherein at least one of the plurality of first bars have a triangular cross section.

12. The apparatus of claim 8 wherein the receptacle is covered with a silicon carbide coating.

13. The apparatus of claim 8 wherein the support is covered with a silicon carbide coating.

14. The apparatus of claim 8 wherein each of the plurality of first openings and each of the plurality of second openings have a first dimension in the first direction and a second dimension, which is smaller than the first dimension, in the second direction.

15. The apparatus of claim 8 wherein each of the plurality of first openings and each of the plurality of second openings are rectangular in shape.

16. The apparatus of claim 8 wherein the plurality of first openings and the plurality of second openings are elongated openings.

17. A method, comprising:
  forming a support having a first side and a second side opposite to the first side, the support including:
    a plurality of bars, each of the plurality of bars having a first width at the first side of the support and a second width at the second side of the support, the first width being smaller than the second width; and
    a plurality of openings, the plurality of bars being spaced from each other by the plurality of openings, each of the plurality of openings having a third width at the first side of the support and a fourth width at the second side of the support, the third width being larger than the fourth width, the second width being smaller than the fourth width;
  positioning the support in a chamber and above a receptacle; and
  positioning a sponge in the receptacle, the sponge configured to absorb material collected by the receptacle.

18. The method of claim 17, further comprising covering the support and the receptacle with a silicon carbide coating.

19. The method of claim 17 wherein the support includes a support bar that extends in a first direction, and the plurality of bars extend in a second direction that is substantially perpendicular to the first direction.

* * * * *